US011562928B2

(12) United States Patent
Lin et al.

(10) Patent No.: US 11,562,928 B2
(45) Date of Patent: Jan. 24, 2023

(54) LASER MARKED CODE PATTERN FOR REPRESENTING TRACING NUMBER OF CHIP

(71) Applicant: OmniVision Technologies, Inc., Santa Clara, CA (US)

(72) Inventors: Wei-Feng Lin, Hsinchu (TW); Chi-Chih Huang, Taoyuan (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 21 days.

(21) Appl. No.: 16/257,223

(22) Filed: Jan. 25, 2019

(65) Prior Publication Data

US 2020/0243384 A1 Jul. 30, 2020

(51) Int. Cl.
*H01L 21/768* (2006.01)
*H01L 23/544* (2006.01)
*H01L 27/146* (2006.01)
*H01L 23/00* (2006.01)

(52) U.S. Cl.
CPC ...... *H01L 21/76894* (2013.01); *H01L 23/544* (2013.01); *H01L 24/26* (2013.01); *H01L 27/14632* (2013.01); *H01L 27/14636* (2013.01)

(58) Field of Classification Search
CPC .................. H01L 24/72; H01L 25/071; H01L 2924/10254
See application file for complete search history.

(56) References Cited

U.S. PATENT DOCUMENTS

| 4,680,460 | A | * | 7/1987 | Drexler | G06K 19/14 235/488 |
|---|---|---|---|---|---|
| 5,175,774 | A | | 12/1992 | Truax et al. | |
| 6,584,371 | B1 | | 6/2003 | Sada et al. | |
| 7,451,010 | B2 | | 11/2008 | Lee et al. | |
| 2005/0023246 | A1 | * | 2/2005 | McEntee | B24B 1/04 216/83 |
| 2012/0292744 | A1 | * | 11/2012 | Liu | H01L 21/78 257/E23.179 |
| 2013/0093036 | A1 | * | 4/2013 | Huang | H01L 31/0232 257/432 |
| 2014/0342508 | A1 | * | 11/2014 | Son | H01L 23/49816 438/126 |
| 2018/0114702 | A1 | * | 4/2018 | Kodani | H01L 23/49827 |

OTHER PUBLICATIONS

Y. Kokushi, Y. Saitou, A. Mori, Micro ID marking for semiconductor chips: recent progress and future prospects, Proc. SPIE 7202, SPIE Feb. 24, 2009.

* cited by examiner

*Primary Examiner* — Monica D Harrison
*Assistant Examiner* — Andre C Stevenson

(57) ABSTRACT

A chip comprises a semiconductor substrate having a first side and a second side opposite to the first side, a plurality of conductive metal patterns formed on the first side of the semiconductor substrate, a plurality of solder balls formed on the first side of the semiconductor substrate, and at least one code pattern formed using laser marking on the first side of the semiconductor substrate in a space free from the plurality of conductive metal patterns and the plurality of solder balls, wherein the at least one code pattern is visible from a backside of the chip, the at least one code pattern represents a binary number having four bits; and the binary number represents a decimal number to represent a tracing number of the chip.

19 Claims, 8 Drawing Sheets

| | Code Pattern | |
|---|---|---|
| 0 | ○○○○ | 200 |
| 1 | ○○○● | 201 |
| 2 | ○○●○ | 202 |
| 3 | ○○●● | 203 |
| 4 | ○●○○ | 204 |
| 5 | ○●○● | 205 |
| 6 | ○●●○ | 206 |
| 7 | ○●●● | 207 |

| | Code Pattern | |
|---|---|---|
| 8 | ●○○○ | 208 |
| 9 | ●○○● | 209 |
| 10 | ●○●○ | 210 |
| 11 | ●○●● | 211 |
| 12 | ●●○○ | 212 |
| 13 | ●●○● | 213 |
| 14 | ●●●○ | 214 |
| 15 | ●●●● | 215 |

Fig. 2

LASER MARKED CODE PATTERN FOR REPRESENTING TRACING NUMBER OF CHIP

FIELD OF THE INVENTION

This invention relates to a laser marked code pattern for representing the tracing number of a chip, and more specifically relates to a laser marked code pattern formed on a semiconductor substrate in a space free from conductive metal patterns and solder balls of a chip for representing the tracing number of the chip.

BACKGROUND OF THE INVENTION

It is a common practice to laser mark a tracing number on a chip to trace its manufacturing history. The tracing number may include a lot ID (identification), a wafer number, and a coordinate of the chip in the wafer. For example, the lot ID may be "P51841X". A lot may consist of 25 wafers, thus the wafer number may be "15". The chip may located at a coordinate of (100,100), thus the coordinate may be 100100. Thus, the tracing number of the chip may be "P51841X15100100". The tracing number "P51841X15100100" is marked using laser on the bottom of the chip.

The tracing number is important because if the defects of a chip come to light, then other chips from the same lot may be traced for taking any necessary action. This is especially important for chips used in medical applications.

As the chip becomes smaller, for example, its bottom surface area may be approximately 0.5 mm×0.5 mm, or less than 1 mm×1 mm, it becomes harder to allocate space for the laser marking (see FIG. 1B). The bottom of the chip is also normally occupied by solder balls. Each ball may have a diameter approximately 0.1 mm.

Accordingly, small chips with cross-section less than 1 mm×1 mm having laser marked code patterns representing tracing number on the bottom of the chip are demanded.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2 illustrates exemplary code patterns to represent codes of decimal numbers "0"-"15", respectively, according to an embodiment of the present invention.

Figure 1A:
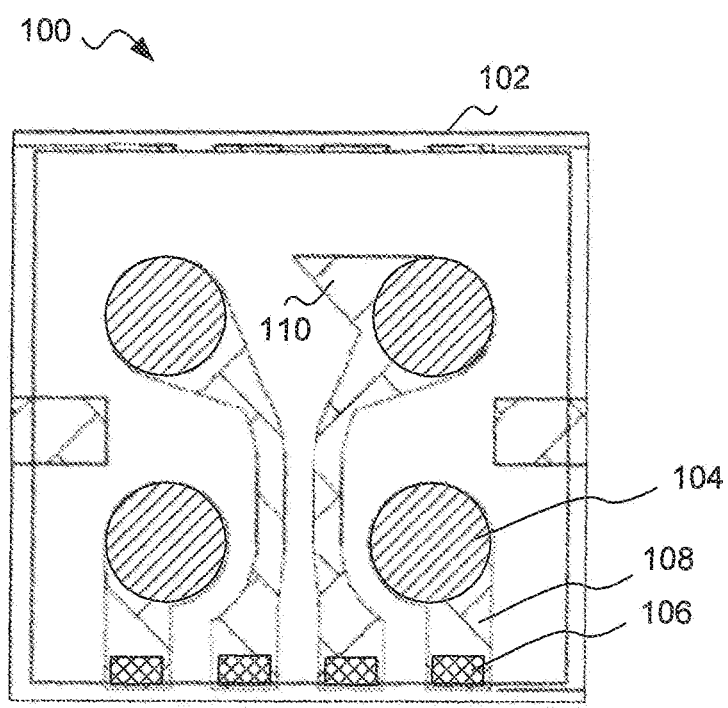
FIG. 1A illustrates an exemplary bottom of a chip viewed from the backside of the chip, according to an embodiment of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

FIG. 1A illustrates an exemplary bottom of a chip 100 viewed from the backside of the chip, according to an embodiment of the present invention. Chip 100 comprises a semiconductor substrate 102 having a first side and a second side opposite to the first side. The first side of semiconductor substrate 102 is viewed as the bottom of chip 100 from the backside of the chip. A plurality, for example, four solder balls 104 of a BGA (ball grid array) are formed on the first side of semiconductor substrate 102. A plurality, for example, four TSVs (through-silicon via) 106 are formed to connect the first side and the second side of semiconductor substrate 102. A plurality, for example, four conductive metal patterns 108 are formed on the first side of semiconductor substrate 102. At least one of plurality of conductive metal patterns 108 is electrically coupled to at least one of solder ball 104. A conductive metal pattern 108 comprises a Pin-1-Mark 110 for indicating the orientation of the bottom of chip 100.

Figure 1B:
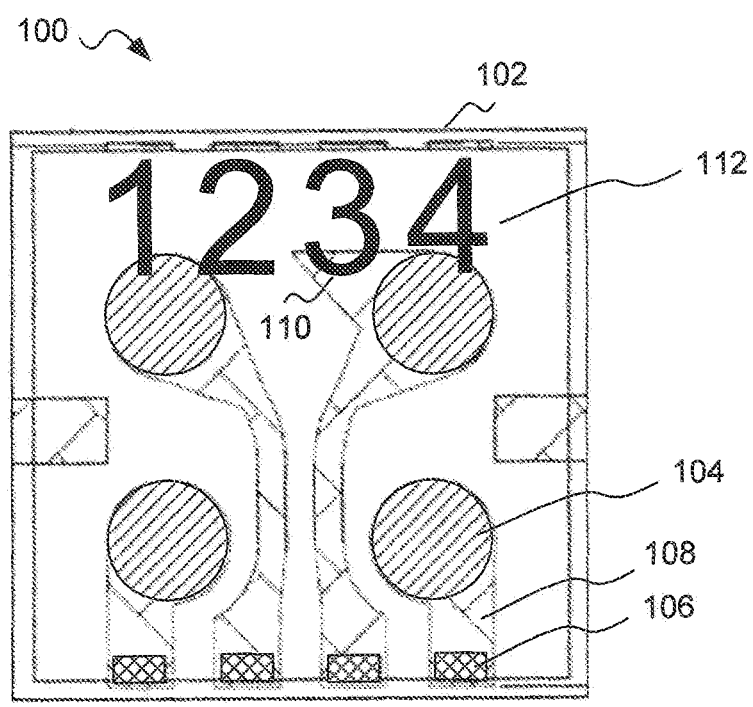
FIG. 1B illustrates an exemplary bottom of a chip viewed from the backside of the chip including a tracing number represented by only four digits, according to an embodiment of the present invention.

For example, the first side of semiconductor substrate 102 has an area of 0.5 mm×0.5 mm, or less than 1 mm×1 mm. There is no space to laser mark any tracing number such as "P51841X15100100" on semiconductor substrate 102. FIG. 1B illustrates a tracing number represented by only four digits 112, "1234", laser marked on the first side of semiconductor substrate 102, according to an embodiment of the present invention. Since laser marking requires the size of each digit no less than 0.1 mm×0.1 mm, there is no sufficient space for laser marking the four digits 112 "1234".

To minimize the space required for marking tracing number, the tracing number (e.g., P51841X15100100) is decomposed into the lot ID (e.g., P51841X), the wafer number (e.g., 15), and the chip coordinate (e.g., 100100). Since the space is limited, the chip coordinate may be omitted. Only the ID lot and the wafer number are marked on the first side of semiconductor substrate 102. Furthermore, the lot ID and the wafer number may be represented by specific code patterns.

For example, a lot ID "AS00807.01" may be coded by the last single digit "7", a lot ID "P7F679" may be coded by the last single digit "9". These codes of single digit, e.g., "0"-"9", are further represented by code patterns as shown in FIG. 2. In an embodiment, a type of chip has only a limited number of lot IDs available. Thus the codes of single digit may be sufficient to retrieve the lot ID. In another embodiment, a code consisting of more than one digits may be necessary.

FIG. 2 illustrates exemplary code patterns 200-215 to represent decimal numbers "0" to "15", respectively, according to an embodiment of the present invention. For example, a code pattern represents a binary number having four bits. The binary number may represent a decimal number to represent the tracing number of the chip. Decimal number 0 is represented by code pattern 200, which is a binary number 0000. Decimal number 1 is represented by code pattern 201, which is a binary number 0001. Decimal number 2 is represented by code pattern 202, which is a binary number 0010. Decimal number 3 is represented by code pattern 203, which is a binary number 0011. Decimal number 4 is represented by code pattern 204, which is a binary number 0100. Decimal number 5 is represented by code pattern 205, which is a binary number 0101. Decimal number 6 is represented by code pattern 206, which is a binary number 0110. Decimal number 7 is represented by code pattern 207, which is a binary number 0111. Decimal number 8 is represented by code pattern 208, which is a binary number 1000. Decimal number 9 is represented by code pattern 209, which is a binary number 1001. Decimal number 10 is represented by code pattern 210, which is a binary number 1010. Decimal number 11 is represented by code pattern 211, which is a binary number 1011. Decimal number 12 is represented by code pattern 212, which is a binary number 1100. Decimal number 13 is represented by code pattern 213, which is a binary number 1101. Decimal number 14 is represented by code pattern 214, which is a binary number 1110. Decimal number 15 is represented by code pattern 215, which is a binary number 1111.

The conversion from binary number to decimal number is illustrated in the following. The decimal value of any binary number can be found as a sum of the weights of bits multiplied to the corresponding bits. For example, a binary number 1101 has weights of all bits $2^3$, $2^2$, $2^1$, and $2^0$, respectively. The decimal value is the sum of $1 \times 2^3 + 1 \times 2^2 + 0 \times 2^1 + 1 \times 2^0 = 8+4+0+1=13$. The codes of single digit "0"-"9" may be represented by code patterns 200-209, respectively.

Figure 3:
FIG. 3 illustrates exemplary code patterns comprising a row of binary number having four bits, two rows of binary number having four bits, and three rows of binary number having four bits, respectively, according to an embodiment of the present invention.
Figure 3:
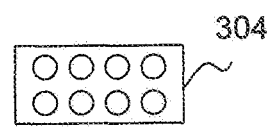
Figure 3:
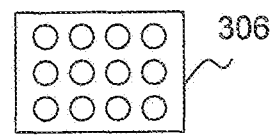

FIG. 3 illustrates code patterns comprising a row of binary number having four bits 302, two rows of binary number having four bits 304, and three rows of binary number having four bits 306, according to an embodiment of the present invention. A code pattern comprises a laser mark representing a bit, or a plurality of laser marks representing a plurality of bits. For example a laser mark is indicated as a black spot as shown in FIG. 2. A laser mark typically has a diameter of approximately 0.010-0.015 mm. A laser mark (black spot) may represent a bit 1 ("one"), and a blank (white spot) may represent a bit 0 ("zero"), or vise versa. A laser marked code pattern may include a row of binary number having four bits 302, two rows of binary number having four bits 304, three rows of binary number having four bits 306, or more than three rows of binary number having four bits, depending on the space available for the marking. It is appreciated that a binary number may have more or less than four bits. For example, a block of three rows of binary number having four bits 306 may occupy a space of approximately 0.04 mm×0.08 mm.

Figure 4A:
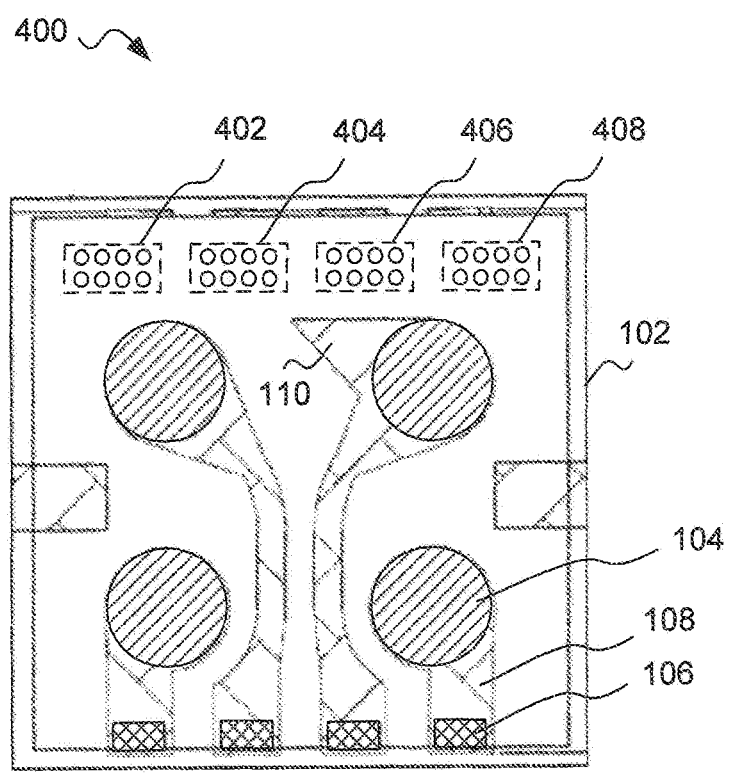
FIG. 4A illustrates an exemplary bottom of a chip viewed from the backside of the chip, according to an embodiment of the present invention.

FIG. 4A illustrates an exemplary bottom of a chip 400 viewed from the backside of the chip, according to an embodiment of the present invention. For example, four laser marked code patterns 402, 404, 406, and 408 are formed using laser marking in a space free from four conductive metal patterns 108 at defined positions. The positions of laser marks are predetermined. Each code pattern may have two rows of binary number having four bits as code pattern 304 of FIG.

For example, each row of four bit binary number is used for representing a decimal number 0-9, which may be a code of single digit. It is appreciated that a four bit binary number is capable of representing 0-15 decimal numbers. The code pattern having two rows of binary number having four bits may represent two decimal numbers. Four code patterns 402, 404, 406, and 408 may represent eight decimal numbers. These eight decimal numbers may be used to represent a lot ID and wafer number. To correctly recognize the code patterns, semiconductor substrate 102 is properly oriented referring to the position of Pin-1-Mark 110. The laser marks may be recognized by referring to their predetermined positions.

It is possible that four code patterns having one row of binary number of four bits may be used to represent four decimal numbers. For example, the four decimal numbers may be "0", "7" "0", "2". The first two decimal numbers "0", "7" may refer to the lot ID "7", and last two decimal numbers "0", "2" may refer to the wafer number "02". The lot ID code "7" may retrieve that the lot ID is "AS00807.01", and the wafer number is 2.

For example, the four decimal numbers may be "6", "1", "1", "2". The first two decimal numbers "6" "1" may refer to the lot ID "61", and last two decimal numbers "1", "2" may refer to the wafer number "12". The lot ID code "61" may retrieve that the lot ID is "P7F761", and the wafer number is 12. In other words, a code pattern may represent a binary number and the binary number may represent a decimal number to represent a tracing number of the chip.

It is appreciated that the rule of coding lot ID may be freely defined. Thus, one may use the last digit of the lot ID as the code, or other digits in the lot as the code. Thus codes for lot ID may be one digit or may be more than one digits. Furthermore, the tracing number may include product version, year, month, and other necessary data and information. Any component of the tracing number may be encoded into a code pattern and marked on the bottom of the chip.

Figure 4B:
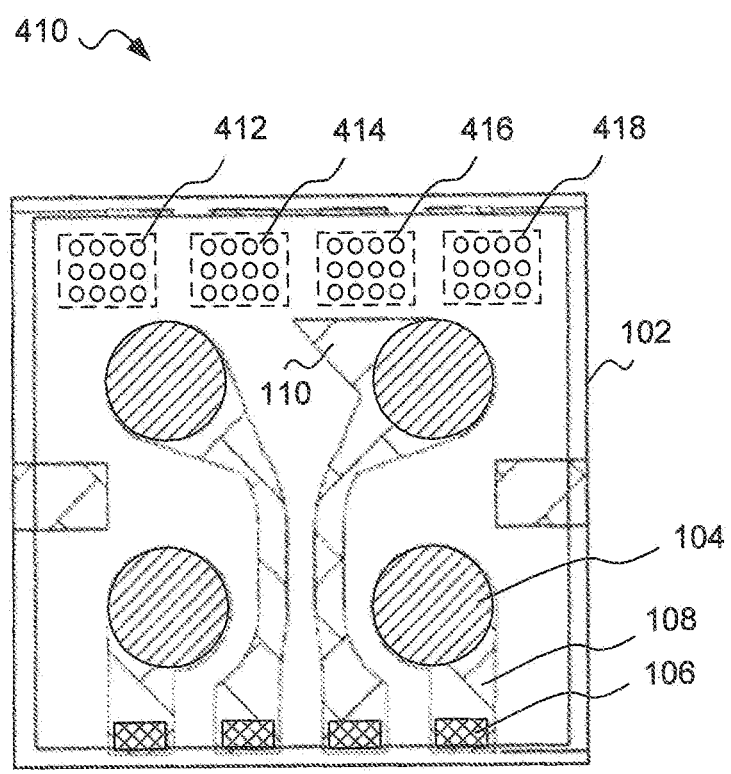
FIG. 4B illustrates an exemplary bottom of a chip viewed from the backside of the chip, according to an embodiment of the present invention.

FIG. 4B illustrates an exemplary bottom of a chip 410 viewed from the backside of the chip, according to an embodiment of the present invention. For example, four laser marked code patterns 412, 414, 416, and 418 are formed using laser marking in a space free from four conductive metal patterns 108 at defined positions. The positions of laser marks are predetermined. Each code pattern may have three rows of binary number having four bits as code pattern 306 of FIG. 3. The size of each code pattern may be approximately 0.04 mm×0.08 mm. The size of laser mark may be approximately 0.010-0.015 mm.

For example, each row of four bit binary number is used for representing a decimal number 0-9. The code pattern having three rows of binary number having four bits may represent three decimal numbers. Four code patterns 412, 414, 416, and 418 may represent twelve decimal numbers. These twelve decimal numbers may be used to represent a tracing number of the chip according to the rule defined. To correctly recognize the code patterns, semiconductor substrate 102 is properly oriented referring to the position of Pin-1-Mark 110. The laser marks may be recognized by referring to their predetermined positions.

Figure 5:
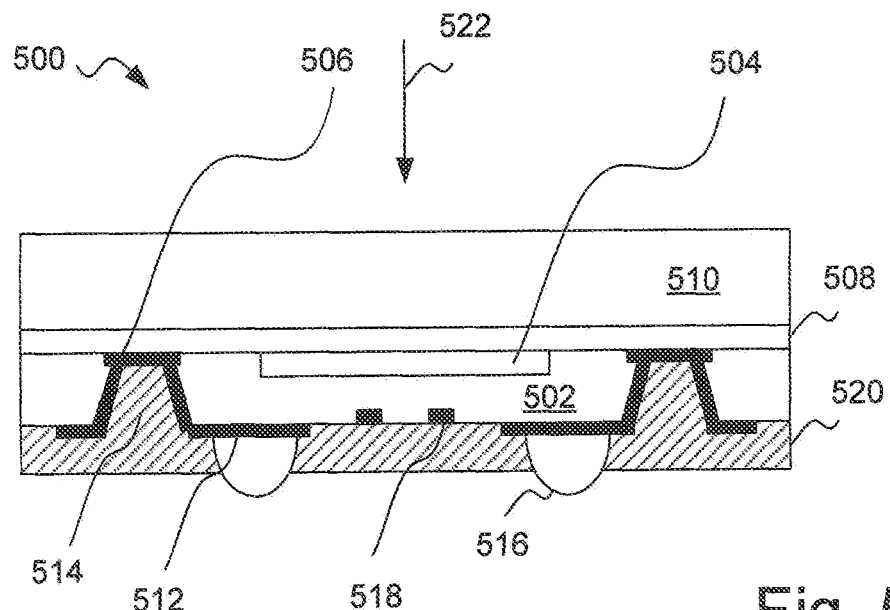
FIG. 5 illustrates an exemplary chip, according to an embodiment of the present invention.

FIG. 5 illustrates an exemplary chip 500, according to an embodiment of the present invention. Chip 500 comprises a semiconductor substrate 502 having a first side and a second side opposite to the first side. An image sensor 504 is formed on the second side of semiconductor substrate 502. A plurality of bonding pads 506 are also formed on the second side of semiconductor substrate 502 electrically coupled to image sensor 504. A bonding epoxy layer 508 is disposed over the second side of semiconductor substrate 502 covering image sensor 504 and the plurality of bonding pads 506. A cover glass 510 is disposed on bonding epoxy layer 508. An incident light 522 forms an image on image sensor 502.

Figure 6:
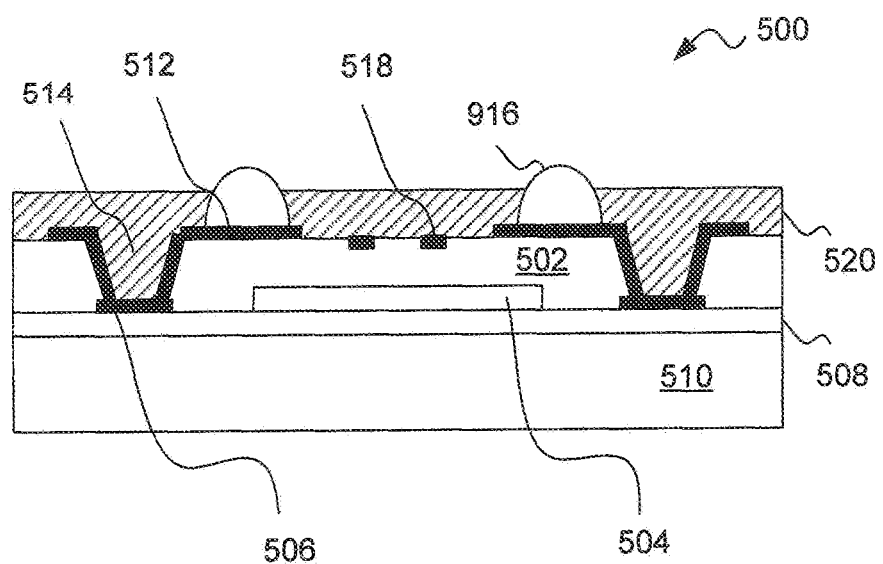
FIG. 6 illustrates chip in FIG. 5 in a reversed (up-side-down) position, according to an embodiment of the present invention.

FIG. 6 illustrates chip 500 in a reversed (up-side-down) position relative to FIG. 5, according to an embodiment of the present invention. In this position, a plurality of conductive metal patterns 512 and a plurality of solder balls 516 are formed on the first side of semiconductor substrate 502. A plurality of TSVs 514 are formed to connect the first side and the second side of semiconductor substrate 502. At least one of plurality of conductive metal patterns 512 is electrically coupled to at least one of plurality of solder balls 516 and at least one of plurality of bonding pad 506 through a TSV of plurality of TSVs 514. At least one code pattern 518, which may be one of code patterns 402, 404, 406, and 408 in FIG. 4A or 412, 414, 416, and 418 in FIG. 4B, is formed using laser marking on the first side of semiconductor substrate 502.

Figure 7:
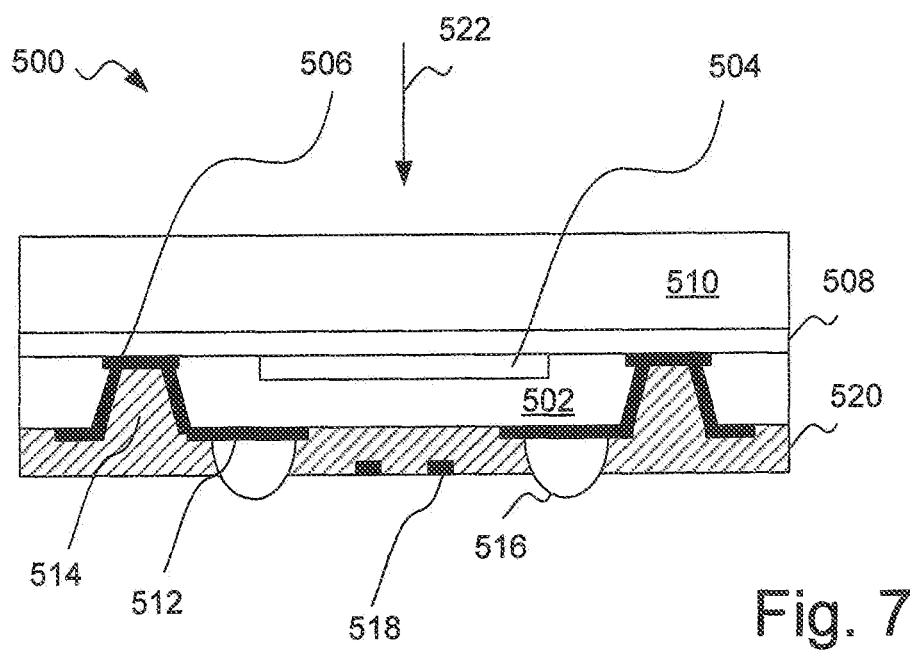
FIG. 7 illustrates an exemplary chip, according to an embodiment of the present invention.

Optionally, a transparent passivation layer 520 is disposed over the first side of semiconductor substrate 502 covering plurality of conductive metal patterns 512 and at least one code pattern 518. Passivation layer 520 may be SiO2 or any suitable materials. Passivation layer 520 protects the surface covered underneath. Accordingly, code patterns 518 on semiconductor substrate 502 is visible from the backside of chip 500. It is appreciated that the at least one code pattern 518 may be formed using laser marking on passivation layer 520 as shown in FIG. 7, according to an embodiment of the present invention.

Semiconductor substrate 502 of chip 500 is a part of a semiconductor wafer (not shown) before chip 500 is singulated from the semiconductor wafer. The tracing number of chip 500 comprises the tracing number of the semiconductor wafer including lot ID and wafer number.

While the present invention has been described herein with respect to the exemplary embodiments and the best mode for practicing the invention, it will be apparent to one of ordinary skill in the art that many modifications, improvements and sub-combinations of the various embodiments, adaptations and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A chip comprising:
   a semiconductor substrate having a first side and a second side opposite to the first side;
   a plurality of conductive metal patterns formed on the first side of the semiconductor substrate;
   a plurality of solder balls formed on the first side of the semiconductor substrate; and
   at least one code pattern formed using laser marking directly on the first side of the semiconductor substrate in a space free from the plurality of conductive metal patterns and the plurality of solder balls;
   wherein the at least one code pattern is visible from a backside of the chip; and
   wherein the at least one code pattern represents a binary number and the binary number represents a decimal number to represent a tracing number of the chip.

2. The chip of claim 1, wherein the at least one code pattern comprises four bits.

3. The chip of claim 1, wherein the at least one code pattern comprises a laser mark representing a bit "zero".

4. The chip of claim 1, wherein the at least one code pattern comprises a laser mark representing a bit "one".

5. The chip of claim 1, wherein at least one of the plurality of solder balls is electrically coupled to at least one of the plurality of conductive metal patterns.

6. The chip of claim 1 further comprising:
   a transparent passivation layer on the first side of the semiconductor substrate covering the at least one code pattern and the plurality of conductive metal patterns.

7. The chip of claim 1, wherein the tracing number of the chip comprises a lot ID (identification), wherein the lot ID is coded by a code, and wherein the code is represented by the at least one code pattern.

8. The chip of claim 1, wherein the tracing number of the chip comprises a wafer number, wherein the wafer number is represented by the at least one code pattern.

9. The chip of claim 1, wherein an area of the first side of the semiconductor substrate is less than 1 mm×1 mm.

10. The chip of claim 3, wherein the laser mark is a spot having diameter less than 15 μm.

11. The chip of claim 3, wherein the laser mark is a spot having diameter larger than 10 μm.

12. The chip of claim 1 further comprising:
   an image sensor formed on the second side of the semiconductor substrate;
   a plurality of TSVs (through-silicon-vias) connecting the first side and the second side of the semiconductor substrate;
   a plurality of bond pads formed on the second side of the semiconductor substrate, wherein at least one of the plurality of conductive metal patterns is coupled to at least one of the plurality of solder balls and at least one of the plurality of bond pads through a TSV of the plurality of TSVs;
   a bonding epoxy layer disposed on the second side of the semiconductor substrate covering the image sensor and the plurality of bond pads;
   a cover glass disposed on the bonding epoxy layer.

13. The chip of claim 1, wherein the semiconductor substrate is a part of a semiconductor wafer, and wherein the tracing number of the chip is a tracing number of the semiconductor wafer.

14. A chip comprising:
a semiconductor substrate having a first side and a second side opposite to the first side;
an image sensor formed on the second side of the semiconductor substrate;
a plurality of bond pads formed on the second side of the semiconductor substrate;
a bonding epoxy layer disposed on the second side of the semiconductor substrate covering the image sensor and the plurality of bond pads;
a cover glass disposed on the bonding epoxy layer;
a plurality of TSVs connecting the first side and the second side of the semiconductor substrate;
a plurality of conductive metal patterns formed on the first side of the semiconductor substrate;
a plurality of solder balls formed on the first side of the semiconductor substrate, wherein at least one of the plurality of conductive metal patterns is coupled to at least one of the plurality of solder balls and at least one of the plurality of bond pads through a TSV of the plurality of TSVs;
at least one code pattern formed using laser marking directly on the first side of the semiconductor substrate in a space free from the plurality of conductive metal patterns and the plurality of solder balls;
wherein the at least one code pattern is visible from a backside of the chip;
wherein the at least one code pattern represents a binary number having four bits; and
the binary number represents a decimal number to represent a tracing number of the chip.

15. The chip of claim 14, wherein the at least one code pattern comprises a laser mark representing a bit "zero".

16. The chip of claim 14, wherein the at least one code pattern comprises a laser mark representing a bit "one".

17. The chip of claim 14, wherein the tracing number of the chip comprises a lot ID, wherein the lot ID is coded by a code, and wherein the code is represented by the at least one code pattern.

18. The chip of claim 14, wherein the tracing number of the chip comprises a wafer number, wherein the wafer number is represented by the at least one code pattern.

19. A chip comprising:
a semiconductor substrate having a first side and a second side opposite to the first side;
a plurality of conductive metal patterns formed on the first side of the semiconductor substrate;
a plurality of solder balls formed on the first side of the semiconductor substrate;
a transparent passivation layer on the first side of the semiconductor substrate covering the plurality of conductive metal patterns; and
at least one code pattern formed using laser marking on the passivation layer;
wherein the at least one code pattern represents a binary number and the binary number represents a decimal number to represent a tracing number of the chip.

* * * * *